(12) United States Patent
Ma

(10) Patent No.: US 7,277,357 B1
(45) Date of Patent: Oct. 2, 2007

(54) METHOD AND APPARATUS FOR REDUCING OSCILLATION IN SYNCHRONOUS CIRCUITS

(75) Inventor: Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/447,740

(22) Filed: Jun. 5, 2006

(51) Int. Cl.
*G11C 8/18* (2006.01)

(52) U.S. Cl. .................. 365/233; 365/189.07; 365/194; 327/156; 331/25; 331/55

(58) Field of Classification Search .................. 331/55; 327/155
See application file for complete search history.

(56) References Cited

U.S. PATENT DOCUMENTS

| | | | |
|---|---|---|---|
| 5,537,068 A | 7/1996 | Konno | |
| 5,828,250 A | 10/1998 | Konno | |
| 6,069,507 A | 5/2000 | Shen et al. | |
| 6,100,735 A | 8/2000 | Lu | |
| 6,300,807 B1 | 10/2001 | Miyazaki et al. | |
| 6,323,705 B1 | 11/2001 | Shieh et al. | |
| 6,373,913 B1 | 4/2002 | Lee | |
| 6,381,194 B2 | 4/2002 | Li | |
| 6,437,613 B2 | 8/2002 | Shim et al. | |
| 6,445,231 B1 | 9/2002 | Baker et al. | |
| 6,446,180 B2 | 9/2002 | Li et al. | |
| 6,476,652 B1 | 11/2002 | Lee et al. | |
| 6,535,043 B2 | 3/2003 | Chen | |
| 6,538,956 B2 | 3/2003 | Ryu et al. | |
| 6,552,587 B2 | 4/2003 | Kim et al. | |
| 6,556,643 B2 | 4/2003 | Merritt | |
| 6,636,093 B1 | 10/2003 | Stubbs et al. | |
| 6,650,160 B2 | 11/2003 | Tanahashi | |
| 6,727,739 B2 | 4/2004 | Stubbs et al. | |
| 6,728,163 B2 | 4/2004 | Gomm et al. | |
| 6,774,687 B2 | 8/2004 | Gomm et al. | |
| 6,774,690 B2 | 8/2004 | Baker et al. | |
| 6,791,381 B2 * | 9/2004 | Stubbs et al. ................ 327/156 |
| 6,853,225 B2 | 2/2005 | Lee | |
| 6,891,415 B2 | 5/2005 | Mikhalev et al. | |
| 6,950,487 B2 | 9/2005 | Lin et al. | |
| 7,109,807 B2 * | 9/2006 | Lin ............................. 331/25 |
| 7,132,898 B2 * | 11/2006 | Lin ............................. 331/25 |
| 7,199,630 B2 * | 4/2007 | Kim ........................... 327/158 |
| 7,221,202 B1 * | 5/2007 | Yayla ......................... 327/158 |
| 2005/0225368 A1 | 10/2005 | Lin | |
| 2005/0280456 A1 | 12/2005 | Lin | |

* cited by examiner

*Primary Examiner*—Tan T. Nguyen
(74) *Attorney, Agent, or Firm*—TraskBritt

(57) ABSTRACT

Control signal oscillation filtering circuits, delay-locked loops, clock synchronization methods and devices and system incorporating control signal oscillation filtering circuits is described. An oscillation filtering circuit includes a first oscillation filter configured to filter oscillations and a majority filter configured to average filter an output of a phase detector and generate in response thereto control signals to an adjustable delay line.

17 Claims, 6 Drawing Sheets

METHOD AND APPARATUS FOR REDUCING OSCILLATION IN SYNCHRONOUS CIRCUITS

BACKGROUND OF THE INVENTION

1. Field of the Invention

The present invention relates generally to memory devices and, more particularly, to memory devices adapted to receive input data and provide output data synchronized with a common external clock signal.

2. State of the Art

Integrated circuits, including memory and processors, which operate in synchronization with an external clock signal, typically generate an internal clock signal for gating the rippling nature of logic and for staging synchronous steps. Because of the inherent latencies associated with successive levels of propagation, the internal clock signal may be delayed when compared with the external clock signal. Such a delay may cause deterioration in the performance of the device during high-frequency operation. For example, during operation at high frequencies, the access time (i.e., the time required for outputting data after receipt of an external clock signal) may become longer than the time required for generating an internal clock signal from the received external clock signal.

Approaches have been explored for reducing the deterioration of the performance of a memory device at higher frequencies, one of which approach includes synchronizing the internal clock signal with the external clock signal. One synchronization implementation includes a delay locked loop (DLL) which is used as an internal clock signal generator. DLLs use an adjustable delay line comprised of a series of connectable delay elements. Digital information is used to either include or exclude a certain number of delay elements within a delay line. In a conventional DLL, a clock input buffer accepts a clock input signal and transmits the signal to one or more delay lines of delay elements. The delay of the delay path is increased from a minimum setting until the edge of the delayed reference clock is eventually time-shifted just past the next corresponding edge of the reference clock. As an element of a conventional DLL, a digital phase detector controls the delay line propagation delay so that the delayed clock remains synchronized with the external or reference clock.

Conventional DLLs suffer from numerous drawbacks. External clock signals are susceptible to noise interference which causes the external clock signal to oscillate around the desired frequency. This oscillation causes the DLL to track the oscillating signal which results in an extended period of time to establish adequate stability for the DLL to assert a "locked" signal directing internal circuits to rely on the internal clock for synchronization with external circuits. Oscillation may be caused by external clock jitter, phase detection circuit noise interference, and process-voltage-temperature (PVT) variations. Oscillation in the DLL circuit causes extra shift(s) to the DLL delay lines consuming extra unnecessary power resulting in a longer duration in establishing a "locked" state.

A need, therefore, exists to improve the performance of DLLs and overcome, or at least reduce, one or more of the problems set forth above.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

This disclosure relates to a high-speed, low-power Delay Locked Loop (DLL) including a filter designed to reduce oscillations in a DLL circuit. High-speed, low-power digital periphery design demands well-controlled and stable DLL functionality to prevent the DLL circuit from oscillating as a result of input clock (e.g., external clock) jitter, phase detection circuit noise interference, and variations due to process-voltage-temperature (PVT) differences. Oscillation in the DLL circuit results in extra shifts to the DLL delay lines, consumption of extra unnecessary power and further causes a postponement of achievement of a DLL locked state.

The various representative embodiments of the present invention are designed to reduce DLL oscillation by early detection of oscillation and cancellation or dampening of the shift oscillations. In one embodiment of the present invention, cancellation of delay line control signal oscillations is accomplished by detection of differing delay line control signals designating opposing shift directions for the delay line in the DLL circuit. In one specific embodiment, the differing delay line control signals are detected by monitoring the delay line control signals directly from the phase detector. In another embodiment, the differing delay line control signals are detected after a majority filter in the DLL circuit. In yet another embodiment, delay line control signals from the phase detector and from the majority filter are conditioned or filtered to minimize oscillations to the delay line. Generally, a current delay line control signal (e.g., shift left or shift right) is compared against a previously buffered control signal. A number of previous control signals may be buffered for comparison and analysis with a current control signal, however, buffering and comparison of multiple control signals increases the response time.

Figure 1:
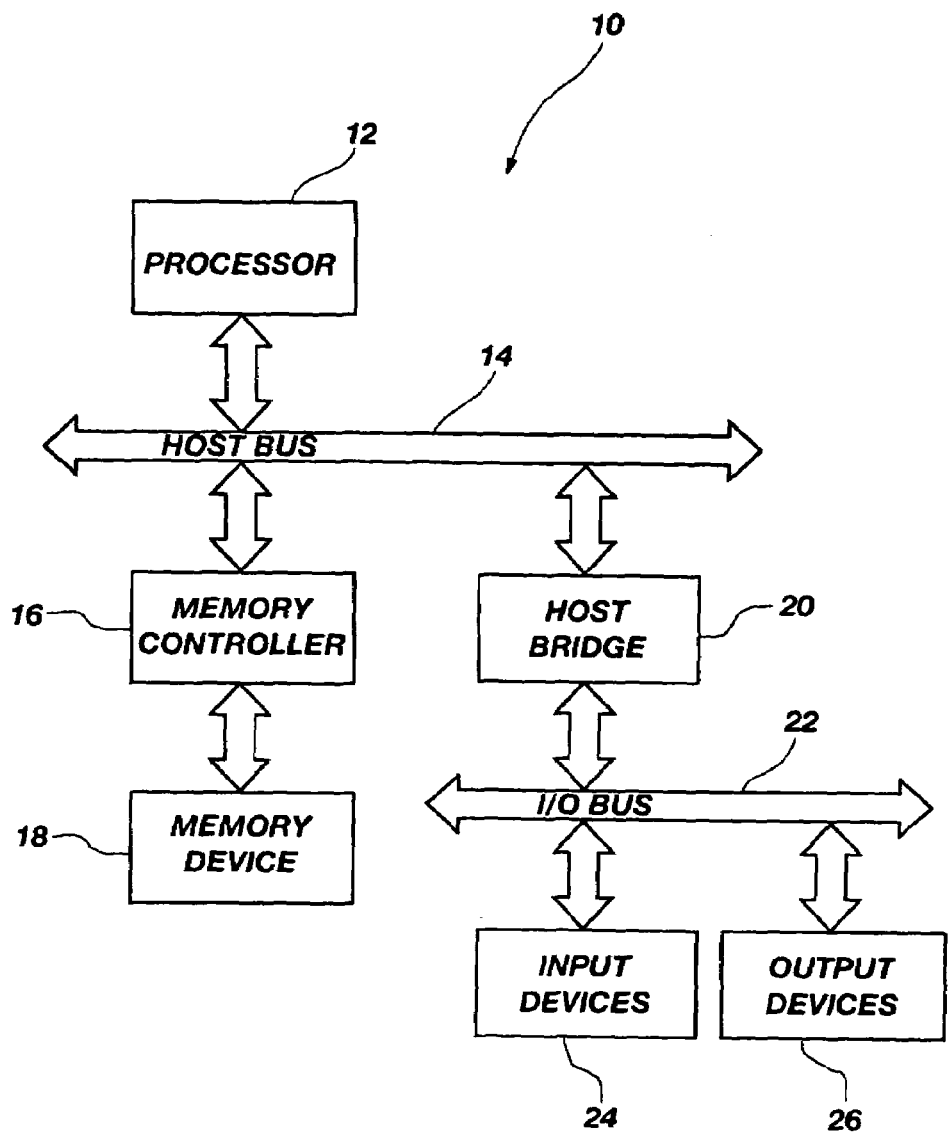
FIG. 1 is a system diagram of an electronic system, in accordance with an embodiment of the present invention.

DLL circuits find application to various electronic circuits and systems, an example of which is a synchronous memory system. In synchronous memory systems, such as in a dynamic random access memory system, the data out latch strobe or clock should be locked or should maintain a fixed relationship to the external clock for high-speed performance. The clock-access and output-hold times are determined by the delay time of the internal circuits. Referring to FIG. 1, a simplified block diagram of an exemplary electronic system 10 (e.g., a computer system) is provided. The electronic system 10 includes a processor 12 coupled to a host bus 14. A memory controller 16 is coupled to both the host bus 14 and a memory device 18. A host bridge 20 couples the host bus 14 to an I/O bus 22 (e.g., a Peripheral Component Interconnect (PCI) bus). One or more input devices 24 couple to the I/O bus 22. Similarly, one or more output devices 26 couple to the I/O bus 22.

The processor 12 communicates with the memory device 18 through the memory controller 16. The memory controller 16 provides memory addresses and logic signals to the memory device 18 to characterize the desired memory transactions. In the illustrated embodiment, the memory device 18 is a synchronous memory device such as a Synchronous Dynamic Random Access Memory (SDRAM). Although the present invention is described in reference to an SDRAM, its application is not so limited. In light of the disclosure herein, the present invention may be adapted for use with other types of memory devices (not shown).

Figure 2:
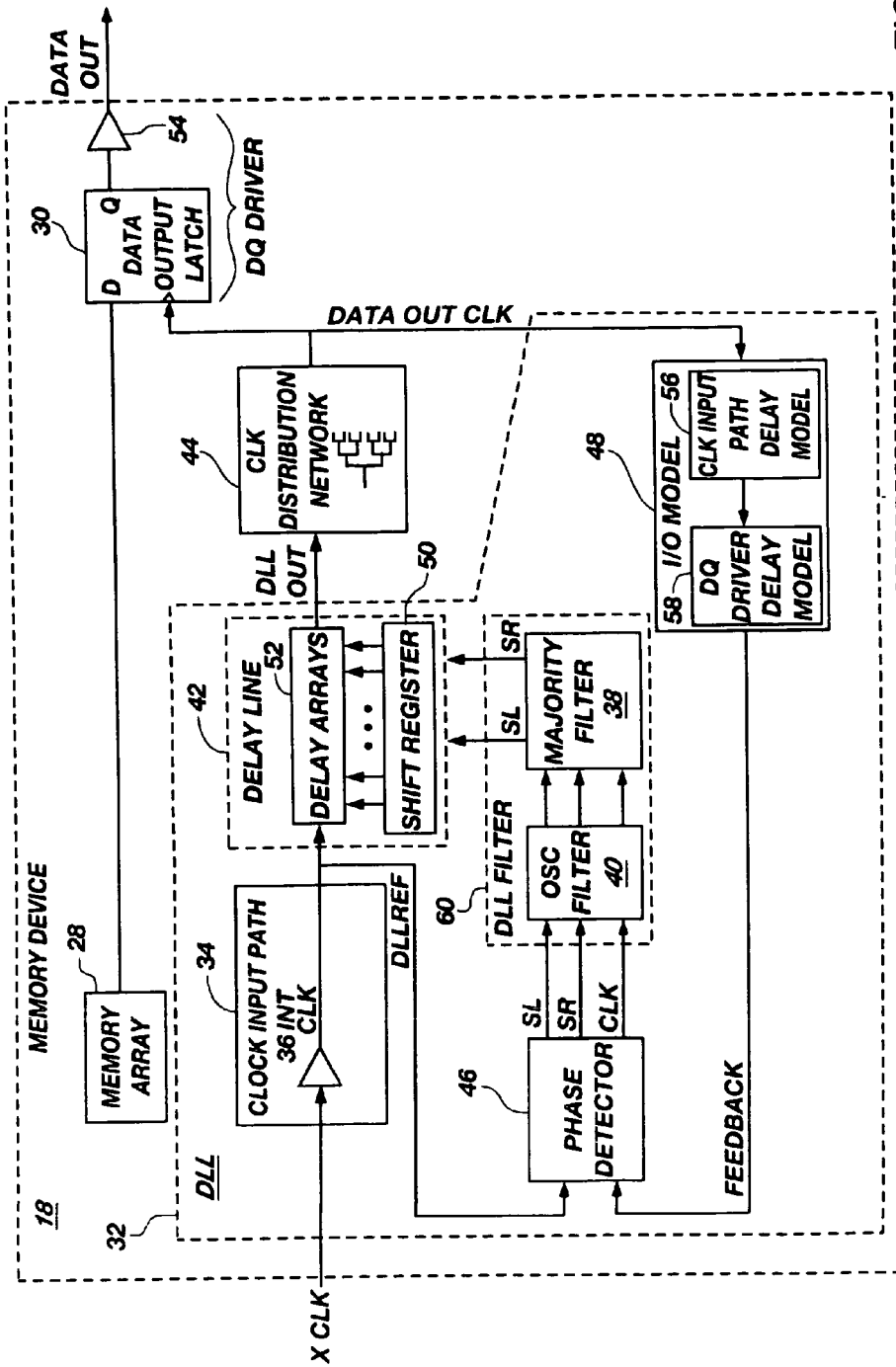
FIG. 2 is a block diagram of a memory device including a DLL for filtering oscillations of an external input clock signal, in accordance with an embodiment of the present invention.
Figure 4:
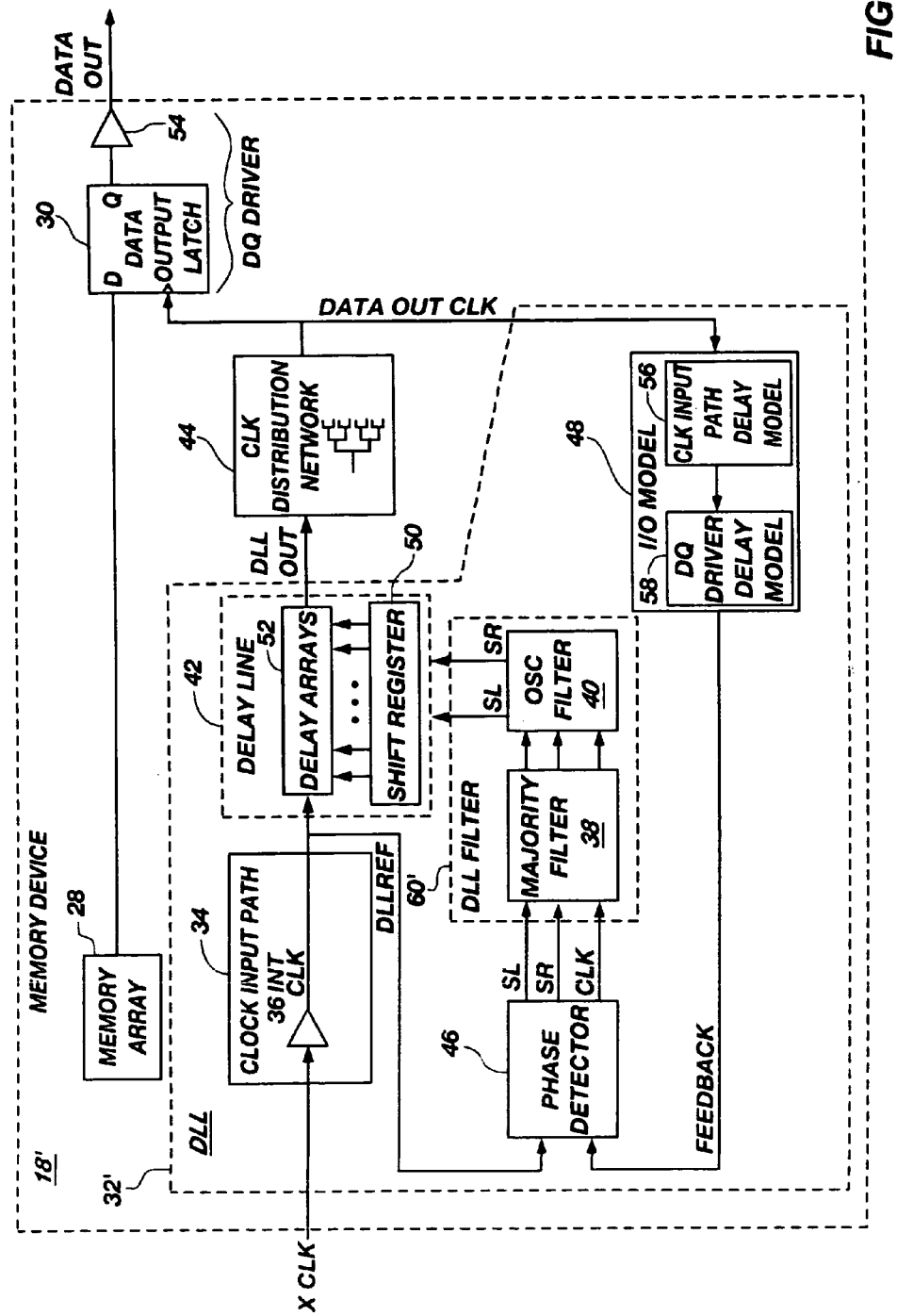
FIG. 4 is a block diagram of a memory device including a DLL for filtering oscillations of an external input clock signal, in accordance with another embodiment of the present invention.
Figure 5:
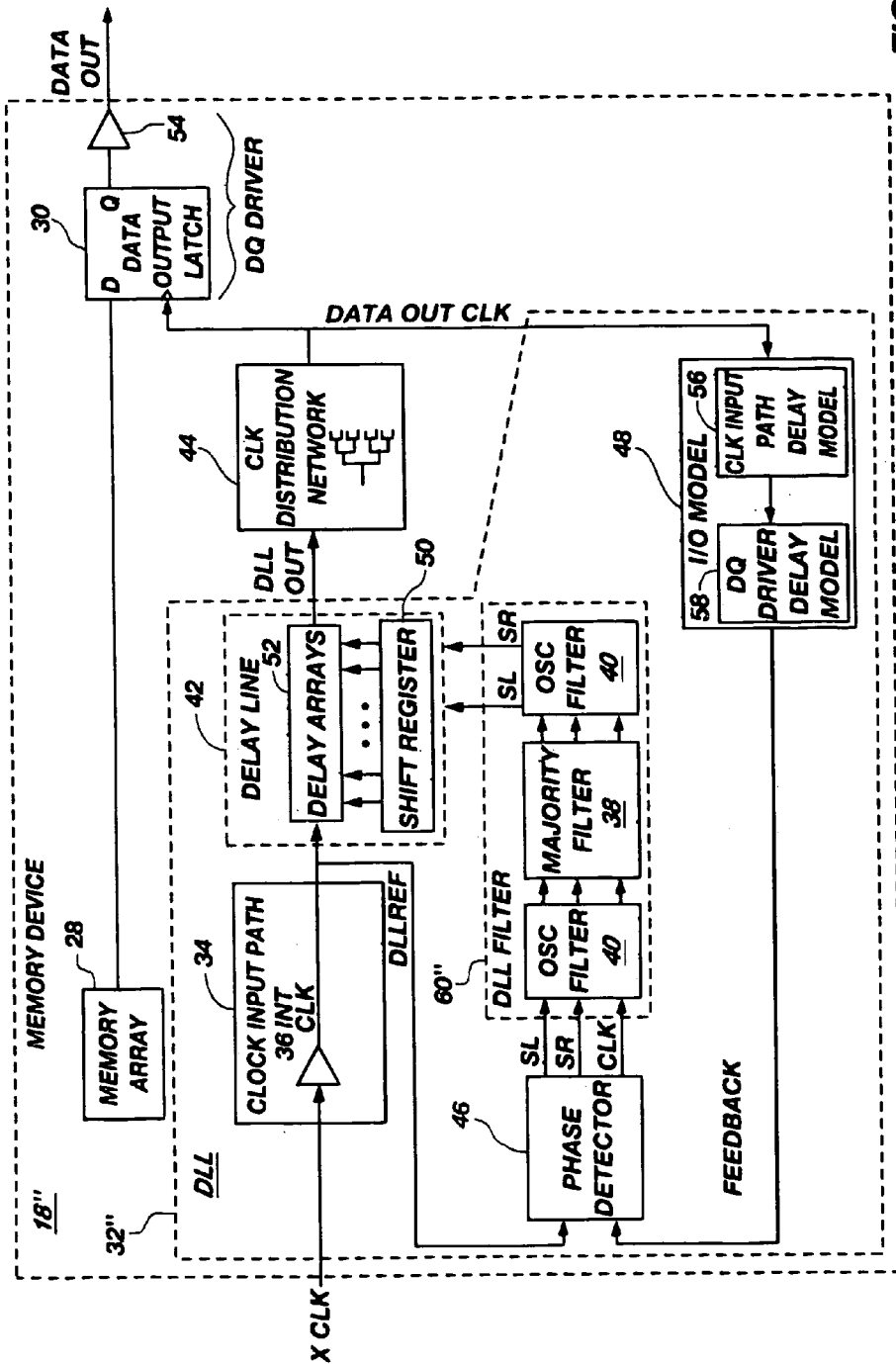
FIG. 5 is a block diagram of a memory device including a DLL for filtering oscillations of an external input clock signal, in accordance with yet another embodiment of the present invention.

FIG. 2, FIG. 4, and FIG. 5 illustrate simplified block diagrams of various embodiments of a memory device 18, in accordance with various exemplary embodiments of the present invention. The various embodiments of FIG. 2, FIG. 4, and FIG. 5 illustrate various placements of one or more oscillation filters within a DLL of a synchronous circuit, such as a memory device.

Referring to a representative embodiment of FIG. 2, memory device 18 includes a memory core or memory array 28 for storing addressable data therein. Memory array 28 may further include pipelines or buffers for staging the delivery of data to a data output latch 30. Pipelining elements are representative of the characteristic delay of the device which is consistent with synchronous memory technologies. Staging or pipelining of data in synchronous memories is understood by those of ordinary skill in the art and is, therefore, not further described herein.

The memory device 18 further includes a DLL 32 implemented to predict the loop delay of a clock signal within memory device 18 and for providing the clock signal to the data output latch 30. DLL 32 includes a clock input path 34 for receiving an external clock signal XCLK. The external clock signal XCLK may originate from a memory controller 16 (FIG. 1) or may be generated independently by a clock generator (not shown) of electronic system 10 (FIG. 1). The external clock signal XCLK may be implemented as a single-ended signal or as differential signals, XCLK and XCLKF. The external clock signal XCLK couples to an input of a clock buffer 36.

The DLL 32 further includes a delay line 42 for receiving a signal DLLREF from the output of clock buffer 36 of the clock input path 34 and for generating a delay line output signal DLLOUT. The delay line 42 is configured to make adjustments to the loop delay by inserting or bypassing propagation delay elements within delay line 42. Those of ordinary skill in the art appreciate that delay line 42 inserts the desired delay into the clocking loop of the memory device such that the internal clock, as delayed by delay line 42, results in a synchronous output of data with the external clock signal XCLK.

Delay line 42 operates in conjunction with a phase detector 46 which generates outputs (e.g., shift left SL, shift right SR and clock CLK) based upon the difference of the input signals. When the difference between the input signals at phase detector 46 varies, phase detector 46 provides adjustments destined for delay line 42 in an attempt to arrive at a zero-phase differential between the input signals presented at the inputs of phase detector 46. Delay line 42 is exemplarily implemented as a digital DLL which includes a shift register 50 which, in the exemplary embodiments, is implemented such that the location of a bit within the shift register indicates the location for the coupling of the reference signal DLLREF, resulting in a determination of the amount of delay inserted by delay line 42. Accordingly, the shift register 50 is responsive to a SHIFT LEFT (SL) signal, and a SHIFT RIGHT (SR) signal.

Delay line 42 further includes one or more delay arrays 52 which correspond to the implementation of one or more delay lines or paths within delay line 42. Delay line 42 may be implemented as a Synchronous Mirror Delay (SMD)-type or, alternatively, may be implemented as multiple independent delay lines within delay line 42. Additional implementations of alternative delay lines are also contemplated within the scope of the present invention. For example, in addition to independent multiple delay lines and SMD-type delays, other more traditional implementations including NAND delays and analog delay elements are also contemplated. The delay line 42 is comprised of one or more delay lines, one of which may be used during an initialization mode and is configured as an SMD-type delay. Such a configuration utilizes two delay lines and attempts to arrive at a fast initial lock. To do so, the SMD configuration measures the difference in phase to save time during the initialization.

Memory device 18 further includes a clock distribution network 44 coupled to DLL 32 by way of a DLL output signal DLLOUT. Clock distribution network 44 facilitates a uniform distribution or fanout to each of the outputs located within a specific memory device. One such specific output from clock distribution network 44 is illustrated as DATAOUTCLK, which provides a latching or strobing clock signal to a data output latch 30. Data output latch 30 couples to memory array 28 and generates an output signal that further couples to a driver 54, forming a DQ DRIVER, while ultimately generating an output signal of memory device 18, illustrated as DATA OUT.

Memory device 18 further includes an I/O model 48 which couples the clock distribution network 44 with the phase detector 46 of DLL 32. I/O model 48 may be placed in the feedback loop path to provide an approximation of actual delays that occur in the input clock path and output data path between the external clock signal XCLK and the data output latch clocking signal DATAOUT CLK. By way of example and not limitation, I/O model 48 includes delay models for clock input path 34, illustrated as clock input path delay model 56, and a delay model characterizing the driver delay associated with data output latch 30 and DQ driver 54, illustrated as DQ driver delay model 58. While other actual delay representations may also be included within I/O model 48, delay models 56 and 58 are representative of those paths which contribute more significantly to the actual input clock path and output data path delay. I/O model 48 generates an output signal FEEDBACK which couples to an input of the phase detector 46.

DLL 32 further includes a DLL filter circuit 60. Unlike an analog-based DLL which includes a transfer function including stability "poles" for a closed loop system, a digital DLL includes no such inherent stability mechanism. Therefore, factors such as loop delay time length, majority filter averaging response time, coarse/fine delay element ratio, and PVT sensitivity can cause DLL oscillation during locking. Accordingly, a digital DLL is susceptible to oscillation when averaging filtering is employed. Therefore, moderation or dampening of potential oscillation may improve the time-to-lock resulting in improved performance and reduced power consumption.

DLL filter circuit 60 includes one or more oscillation filters 40 and a majority filter 38. In the present embodiment, an oscillation filter 40 couples to the phase detector 46 for receiving the control signals from the phase detector 46. Oscillation filter 40 filters oscillations from the phase detector control signals and generates oscillation filtered control signals. A majority filter 38 couples to oscillation filter 40 and receives the oscillation filtered control signals from oscillation filter 40. Majority filter 38 performs an averaging process on the oscillation filtered control signals and generates majority filtered control signals for use as the delay line control signals for controlling delay line 42.

Majority filters 38 is configured to receive control signals (e.g., shift left, shift right, clk) and generate in response thereto majority filtered control signals (e.g., averaged shift left, averaged shift right). Majority filter 38 provides averaging of a counted quantity of consecutive shifts to generate one valid shift and then resets to accumulate another counted quantity of consecutive shifts resulting in the generation of another shift command. Majority filter 38 acts as a buffer circuit for delaying the shifting of the output signals until a count or trend is achieved. Generally, majority filter 38 ensures that a directional shift count reaches a predetermined quantity before an actual shift in the delay line occurs. Such a delay inserted by the majority filter 38 suppresses noise and other aberrant signals that are not sustained for an adequate duration.

As stated, majority filter 38 receives shifting commands or control signals and filters the shift commands until a predetermined quantity (e.g., 16) of shift commands have been received. By accumulating shift commands and delaying the generation of majority-filtered shift commands by a predetermined quantity, the majority filter 38 prevents a premature shift command that may result in an unnecessary adjustment to the delay line. Majority filter 38 may be implemented using an arrangement of counters that are resettable upon a sufficient change in count direction.

While the averaging effect of a majority filter requires a quantity of sustained control signals to generate an actual change in the delay line, oscillation of the delay line is not completely suppressed. As stated, DLL filter circuit 60 further includes one or more oscillation filters 40. An oscillation filter is configured according to the state diagram of FIG. 3. Generally, the oscillation filter targets opposite shift commands and validates or nullifies the shift command by comparing the shift command to a previously buffered shift command. The oscillation filter may be configured to include any number of stages; however, the number of stages to be buffered may depend on the desired response time and available circuit area. The oscillation filter may be implemented according to logic state machine (e.g., Mealy) design techniques, synchronous counter, or shift-register chain.

Figure 3:
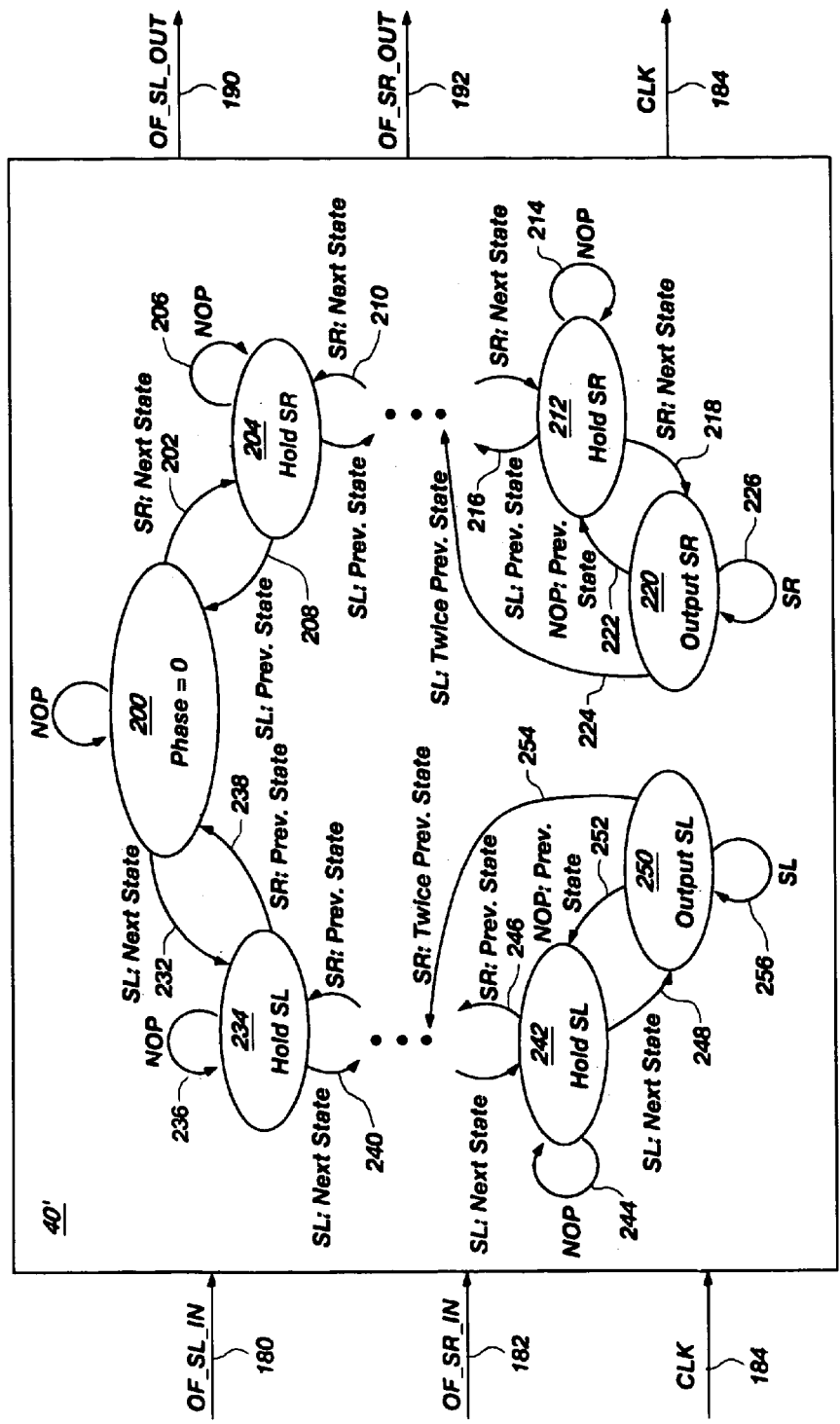
FIG. 3 is a state diagram illustrating an oscillation filtering process for filtering oscillations of an external clock signal, in accordance with an embodiment of the present invention.

FIG. 3 illustrates an oscillation filter configured as a state machine, in accordance with an embodiment of the present invention. Oscillation filter 40' includes input signals for receiving control signals or shift commands and generates output signals designating control signals or shift commands that have been filtered by oscillation filter 40'. As defined herein, oscillation filter input signals include oscillation filter shift left input signal OF_SL_IN 180, oscillation filter shift right input signal OF_SR_IN 182, and a synchronizing clock signal CLK 184. Output signals from the oscillation filter include oscillation filter shift left output signal OF_SL_OUT 190, oscillation filter shift right output signal OF_SR_OUT 192, and a synchronizing clock signal. CLK 184. As described herein for the purposes of brevity, an "SL" command designates the receipt of an OF_SL_IN signal at the input of oscillation filter 40'. Similarly, a "SR" command designates the receipt of an OF_SR_IN signal at the input of oscillation filter 40'. A "NOP" command designates the absence of both an SL command and an SR command at the inputs of oscillation filter 40'.

Oscillation filter 40' initializes to a state 200 where a phase of left and right shifts are equal, such as equal to zero. In the present implementation, processing occurs through the traversal of various states in a state machine that generates outputs or refrains from generating outputs according to the state. State changes may occur when SR commands, SL commands, and NOP commands are received and each state is responsive to each of the command options. When an SR command is received 202, a state change to the next state 204 occurs and the SR command is held. When in state 204, (i) receipt 206 of a NOP command results in no state change; (ii) receipt 208 of an SL command causes a return to a previous state 200; and (iii) receipt 210 of a subsequent SR command causes a state transition to a next state closer to the generation of an SR command at the output signal OF_SR_OUT 192 from oscillation filter 40'. As stated, the quantity of states may be a function of desired response time, oscillation ripple magnitude to be suppressed as well as other circuit design constraints.

State 212 defines a state just prior to the generation of an SR command at output signal OF_SR_OUT 192. When in state 212, (i) receipt 214 of a NOP command results in no state change; (ii) receipt 216 of an SL command causes a return to a previous state; and (iii) receipt 218 of a subsequent SR command causes a state transition to a next state which is output state 220 to generate an SR command at output signal OF_SR_OUT 192 from oscillation filter 40'. When in state 220, (i) receipt 222 of a NOP command results in a state change to a previous state 212 where the SR command is held and no output is generated; (ii) receipt 224 of an SL command causes at least a double reversion of states to a state prior to state 212; and (iii) receipt 226 of a subsequent SR command causes no state change and continues to generate a subsequent SR command at output signal OF_SR_OUT 192 from oscillation filter 40'.

Traversal of the output signal branch for the output signal OF_SL_OUT 190 is now described. In a state 200 where the phase or left shifts and right shifts is equal, for example zero, a state change occurs when an SL command is received 232, a state change to the next state 234 occurs and the SL command is held. When in state 234, (i) receipt 236 of a NOP command results in no state change; (ii) receipt 238 of a SR command causes a return to a previous state 200; and (iii) receipt 240 of a subsequent SL command causes a state transition to a next state closer to the generation of an SL command at the output signal OF_SL_OUT 190 from oscillation filter 40'. As stated, the quantity of states may be a function of desired response time, oscillation ripple magnitude to be suppressed as well as other circuit design constraints.

State 242 defines a state just prior to the generation of an SL command at output signal OF_SL_OUT 190. When in state 242, (i) receipt 244 of a NOP command results in no state change; (ii) receipt 246 of an SR command causes a return to a previous state; and (iii) receipt 248 of a subsequent SL command causes a state transition to a next state which is output state 250 to generate an SL command at output signal OF_SL_OUT 190 from oscillation filter 40'. When in state 250, (i) receipt 252 of a NOP command results in a state change to a previous state 242 where SL command is held and no output is generated; (ii) receipt 254 of an SR command causes at least a double reversion of states to a state prior to state 242; and (iii) receipt 256 of a subsequent SL command causes no state change and continues to generate a subsequent SL command at output signal OF_SL_OUT 190 from oscillation filter 40'.

As illustrated in FIG. 3, when oscillation filter 40' is in a state 220, the state distance between a subsequent outputting of an SR command at output signal OF_SR_OUT 192 is an execution distance of one when a subsequent receipt of a SR command is received. However, when in state 220, the execution distance to the outputting of an SL command at output signal OF_SL_OUT 190 is the execution distance of many receipts of SL commands for causing state traversals up through states 212, . . . , 204, 200 and then down through states 234, . . . , 242 until an opposing shifting output of an SL command at output signal OF_SL_OUT 190 is generated in state 250. This difference in execution distance results in the suppression or filtering of oscillations which is not adequately addressed when a majority filter configured to operation on an averaging principle is solely implemented.

FIG. 4 is block diagram of a memory device including a DLL for filtering oscillations of an external input clock signal, in accordance with another embodiment of the present invention. The embodiment of FIG. 4 includes another configuration of an oscillation filter and a majority filter within a DLL of a synchronous circuit, such as a memory device.

Referring to a representative embodiment of FIG. 4, memory device 18' includes memory array 28 and a DLL 32' implemented to predict the loop delay of a clock signal within memory device 18' and for providing the clock signal to the data output latch 30. DLL 32' includes a clock input path 34 for receiving an external clock signal XCLK which couples to an input of a clock buffer 36. DLL 32' further includes a delay line 42 operating in conjunction with a phase detector 46 which generates outputs (e.g., shift left SL, shift right SR and clock CLK) based upon the difference of the input signals. Delay line 42 further includes one or more delay arrays 52 as described hereinabove. Memory device 18' further includes a clock distribution network 44 also described hereinabove which provides a clock signal to a data output latch 30. Data output latch 30 couples to memory array 28 and generates an output signal that further couples to a driver 54, forming a DQ DRIVER, while ultimately generating an output signal of memory device 18', illustrated as DATA OUT. Memory device 18' further includes an I/O model 48 which couples the clock distribution network 44 with the phase detector 46 of DLL 32'.

DLL 32' further includes a DLL filter circuit 60'. DLL filter circuit 60' includes one or more oscillation filters 40 and a majority filter 38. In the present embodiment, a majority filter 38 couples to the phase detector 46 for receiving the phase detector control signals from the phase detector 46. Majority filter 38 averages the phase detector control signals and generates majority filtered control signals. An oscillation filter 40 couples to majority filter 38 and receives the majority filtered control signals from majority filter 38. Oscillation filter 40 performs oscillation filtering on the majority filtered control signals and generates oscillation filtered control signals for use as the delay line control signals for controlling delay line 42.

FIG. 5 is block diagram of a memory device including a DLL for filtering oscillations of an external input clock signal, in accordance with yet another embodiment of the present invention. The embodiment of FIG. 5 illustrates another placement of one or more oscillation filters within a DLL of a synchronous circuit, such as a memory device. Specifically, the embodiment of FIG. 5 illustrates a DLL filter circuit including two oscillation filters and one majority filter.

Referring to a representative embodiment of FIG. 5, memory device 18" includes a memory core or memory array 28 and a DLL 32" implemented to predict the loop delay of a clock signal within memory device 18" and for providing the clock signal to the data output latch 30. DLL 32" includes a clock input path 34 for receiving an external clock signal XCLK which couples to an input of a clock buffer 36. DLL 32" further includes a delay line 42 operating in conjunction with a phase detector 46 which generates outputs (e.g., shift left SL, shift right SR and clock CLK) based upon the difference of the input signals. Delay line 42 further includes one or more delay arrays 52 as described hereinabove. Memory device 18" further includes a clock distribution network 44 also described hereinabove which provides a clock signal to a data output latch 30. Data output latch 30 couples to memory array 28 and generates an output signal that further couples to a driver 54, forming a DQ DRIVER, while ultimately generating an output signal of memory device 18", illustrated as DATA OUT. Memory device 18" further includes an I/O model 48 which couples the clock distribution network 44 with the phase detector 46 of DLL 32".

DLL 32" further includes a DLL filter circuit 60". DLL filter circuit 60" includes one or more oscillation filters 40 and a majority filter 38. In the present embodiment, a first oscillation filter 40 couples to the phase detector 46 for receiving the phase detector control signals from the phase detector 46. First oscillation filter 40 filters oscillations from the phase detector control signals and generates oscillation filtered control signals. A majority filter 38 couples to first oscillation filter 40 and receives the oscillation filtered control signals from first oscillation filter 40. Majority filter 38 performs an averaging process on the oscillation filtered control signals and generates majority filtered control signals.

DLL filter circuit 60" of FIG. 5 further includes a second oscillation filter 40 coupled to the majority filtered control signals as generated by majority filter 38. Second oscillation filter 40 performs oscillation filtering on the majority filtered control signals and generates oscillation filtered control signals for use as the delay line control signals for controlling delay line 42. Thus, in the present embodiment, first oscillation filter 40 suppresses oscillations as received from phase detector 46 and second oscillation filter 40 suppresses residual oscillations from the majority filtered control signals as generated by majority filter.

Figure 6:
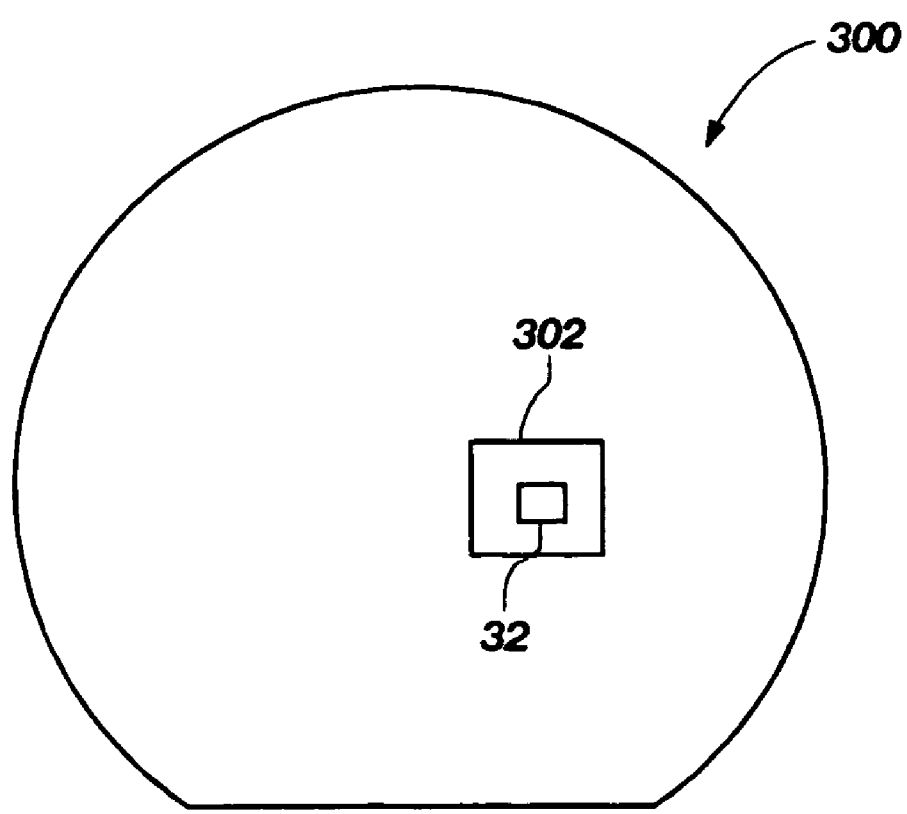
FIG. 6 illustrates a semiconductor wafer including one or more devices which include memory device having a DLL therein, in accordance with an embodiment of the present invention.

FIG. 6 illustrates a semiconductor wafer including one or more devices which include a memory device having a DLL therein, in accordance with an embodiment of the present invention. A wafer 300, which includes multiple integrated circuits 302, at least one of which incorporates a DLL 32 (FIG. 2), DLL 32' (FIG. 4), and DLL 32" (FIG. 5), in accordance with one or more embodiments of the present invention. In one embodiment, the wafer includes a semiconductor substrate, such as a silicon, germanium, gallium arsenide or indium phosphide wafer. In other embodiments, the substrate can be an insulator such as glass or aluminum, or a metal such as stainless steel or iron. After processing the substrate to form the various circuit elements of the clock synchronization circuit, and any other circuit elements included in the integrated circuit, each integrated circuit 302 may be singulated into individual semiconductor dice, packaged, and incorporated into an electronic system. When the wafer includes integrated memory circuits, the substrate also includes a plurality of memory cells supported by the substrate.

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A delay-locked loop, comprising:
    a delay line having first and second inputs and an output, the first input configured to receive an external clock signal via a clock input path and the output configured to couple with an output driver of a memory device;
    an I/O model having an output and an input, the input of the I/O model configured to couple with the output of the delay line via a clock distribution network of the memory device, the I/O model configured to model delay of the output driver;
    a phase detector having forward and feedback path inputs and an output, the forward path input coupled to the first input of the delay line and the feedback path input coupled to the output of the I/O model; and
    a filter circuit having an input coupled to the output of the phase detector and an output coupled to the second input of the delay line, the filter circuit including a first oscillation filter and a majority filter for filtering oscillations from input signals received on the input and generating oscillation filtered control signals on the output.

2. The delay-locked loop of claim 1, wherein the first oscillation filter further includes oscillation filter input signals and oscillation filter output signals and further including an output shift left command state, an output shift right command state and at least one no-output state therebetween and further configured to transition toward the output shift left command state when the shift left command is received and to transition toward the output shift right command state when the shift right command is received.

3. The delay-locked loop of claim 2, wherein the majority filter further includes majority filter input signals and majority filter output signals and further configured to output as the majority filter control signals an output shift right command and an output shift left command upon an accumulation of a minimum quantity of each respective command.

4. The delay-locked loop of claim 3, wherein the first oscillation filter and the majority filter are serially coupled together with an output of one coupled to an input of the other.

5. The delay-locked loop of claim 4, wherein the oscillation filter output signals are coupled to the majority filter input signals.

6. The delay-locked loop of claim 4, wherein the majority filter output signals couple to the oscillation filter input signals.

7. The delay-locked loop of claim 4, further comprising a second oscillation filter including oscillation filter input signals and oscillation filter output signals, and wherein the oscillation filter output signals of the first oscillation filter couple to the majority filter input signals and the majority filter output signals couple to the oscillation filter input signals of the second oscillation filter.

8. A delay-locked loop, comprising:
    a forward delay path having an input configured to couple with an external clock signal and an output configured to couple with an output driver of a memory device, the forward delay path including an adjustable delay line configured to adjust delay of the external clock signal through the forward delay path;
    a feedback delay path having an output and an input, the input of the feedback delay path configured for coupling with the output driver of the memory device, the feedback delay path including a delay model of the output driver of the memory device;
    a phase detector having forward and feedback path inputs and an output, the forward path input coupled to the adjustable delay line and the feedback path input coupled to the output of the feedback delay path; and
    a filter circuit having an input coupled to the output of the phase detector and an output coupled to the adjustable delay line, the filter circuit including a first oscillation filter and a majority filter for filtering oscillations from the output of the phase detector and generating oscillation filtered control signals to the adjustable delay line on the output.

9. The delay-locked loop of claim 8, wherein the first oscillation filter and the majority filter are serially coupled together with an output of one coupled to an input of the other.

10. The delay-locked loop of claim 9, wherein an output of the oscillation filter couples to an input of the majority filter.

11. The delay-locked loop of claim 9, wherein an output of the majority filter couples to an input of the oscillation filter.

12. The delay-locked loop of claim 9, further comprising a second oscillation filter and wherein the output signals from the first oscillation filter couple to input signals of the majority filter and output signals of the majority filter couple to input signals of the second oscillation filter.

13. A clock synchronization method, comprising:
    inputting an external clock signal into a forward loop path;
    detecting a phase difference between a forward loop path delay and a feedback loop path delay;
    filtering oscillations from the phase difference to generate control signals for adjusting the forward loop path delay;
    adjusting the forward loop path delay in response to the control signals; and
    generating an output clock at an output of the forward loop path.

14. The clock synchronization method of claim 13, wherein filtering comprises filtering oscillations from the phase difference with a first oscillation filter and average filtering the phase difference with a majority filter.

15. The clock synchronization method of claim 14, further comprising first filtering oscillations from the phase difference in the first oscillation filter and then average filtering an output of the first oscillation filter in the majority filter, wherein an output of the majority filter comprises the control signals.

16. The clock synchronization method of claim 15, further comprising secondly oscillation filtering in a second oscillation filter the output of the majority filter, wherein an output of the second oscillation filter comprises the control signals.

17. The clock synchronization method of claim 14, further comprising first average filtering the phase difference in the majority filter and then oscillation filtering an output of the majority filter in the first oscillation filter, wherein an output of the first oscillation filter comprises the control signals.

* * * * *